United States Patent
Ge et al.

(10) Patent No.: US 10,642,116 B2
(45) Date of Patent: May 5, 2020

(54) DISPLAY PIXELS WITH IMPROVED STORAGE CAPACITANCE

(71) Applicant: Apple Inc., Cupertino, CA (US)

(72) Inventors: Zhibing Ge, Sunnyvale, CA (US); Lei Zhao, Cupertino, CA (US); Ming-Chin Hung, Cupertino, CA (US); Szu-Hsien Lee, Cupertino, CA (US); Cheng Chen, San Jose, CA (US); Shih-Chang Chang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 856 days.

(21) Appl. No.: 14/256,852

(22) Filed: Apr. 18, 2014

(65) Prior Publication Data
US 2014/0327851 A1    Nov. 6, 2014

Related U.S. Application Data

(60) Provisional application No. 61/818,235, filed on May 1, 2013.

(51) Int. Cl.
*G02F 1/1362* (2006.01)
*G02F 1/1343* (2006.01)
*H01L 27/12* (2006.01)

(52) U.S. Cl.
CPC .. *G02F 1/136213* (2013.01); *G02F 1/134363* (2013.01); *G02F 1/136227* (2013.01); *H01L 27/1255* (2013.01); *G02F 2001/134372* (2013.01)

(58) Field of Classification Search
CPC ......... G02F 1/134363; G02F 1/136213; G02F 1/136227; G02F 2001/134372; H01L 27/1255
See application file for complete search history.

(56) References Cited

U.S. PATENT DOCUMENTS

| | | | |
|---|---|---|---|
| 5,247,289 A | 9/1993 | Matsueda | |
| 6,724,459 B2 * | 4/2004 | Yoon | G02F 1/133514 349/115 |
| 6,812,912 B2 | 11/2004 | Miyajima et al. | |
| 7,375,785 B2 * | 5/2008 | Lai | G02F 1/134363 349/141 |
| 8,525,766 B2 | 9/2013 | Park et al. | |
| 2007/0030432 A1 | 2/2007 | Chen | |

(Continued)

*Primary Examiner* — Michael H Caley
*Assistant Examiner* — Agnes Dobrowolski
(74) *Attorney, Agent, or Firm* — Treyz Law Group, P.C.; Matthew R. Williams

(57) ABSTRACT

A display may include one or more display pixels in an array of pixels. A display pixel may include a storage capacitor chat stores a pixel data signal. The storage capacitor may be formed from a pixel electrode structure, a capacitor electrode structure, and a common electrode structure that is interposed between the pixel electrode structure and capacitor electrode structures. Each electrode structure may be formed from transparent conductive materials deposited on respective display layers. The pixel electrode structure and capacitor electrode structure may be electrically coupled by a conductive via structure that extends through the display layers without contacting the common electrode structure. The conductive via structure may contact underlying transistor structures such as a source-drain structure.

20 Claims, 19 Drawing Sheets

(56) References Cited

U.S. PATENT DOCUMENTS

| | | | |
|---|---|---|---|
| 2009/0115950 A1* | 5/2009 | Toyota | G02F 1/136213 349/114 |
| 2011/0050551 A1* | 3/2011 | Ota | G02F 1/134363 345/87 |
| 2011/0148743 A1* | 6/2011 | Kuo | G02F 1/134309 345/55 |
| 2012/0068944 A1* | 3/2012 | Oh | G02F 1/13338 345/173 |
| 2013/0015449 A1* | 1/2013 | Lee | H01L 27/1255 257/59 |
| 2015/0311227 A1* | 10/2015 | Moriwaki | G02F 1/134363 257/43 |

* cited by examiner

DISPLAY PIXELS WITH IMPROVED STORAGE CAPACITANCE

This application claims the benefit of provisional patent application No. 61/818,235, filed May 1, 2013, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

It can be challenging to form displays for electronic devices. Displays such as liquid crystal displays typically include an array of pixels. Each pixel receives a data signal that is used by the pixel to display image information during display frames. The pixel includes a storage capacitor that stores the data signal during each display frame. The storage capacitor is typically formed between pixel electrodes that control a layer of liquid crystal and a common electrode. In some scenarios such as for twisted-nematic (TN) displays, a common electrode is formed on a color filter substrate (e.g., glass), whereas the pixel electrode is formed over an additional common electrode formed on a thin-film transistor substrate (e.g., glass). The color filter substrate covers the thin-film transistor substrate. For displays such as in-plane switching (IPS) displays or fringe field switching (FFS) displays, display layers are typically formed over a single display substrate (e.g., glass). With ever-increasing display resolution, the available area for pixel electrodes is reduced, which constrains the maximum capacitance between the pixel electrodes and the common electrode and potentially results in insufficient storage capacitance and display performance shortcomings.

It would therefore be desirable to be able to provide improved displays for electronic devices.

SUMMARY

A display may include one or more display pixels in an array of pixels. A display pixel may include transistor structures that receive a pixel data signal. The display pixel may include a storage capacitor that stores the pixel data signal. The storage capacitor may be formed from a pixel electrode structure, a capacitor electrode structure, and a common electrode structure that is interposed between the pixel electrode structure and capacitor electrode structures. Each electrode structure may be formed from transparent conductive materials deposited on respective display layers such as passivation or organic layers. The pixel electrode structure may use the pixel data signal to control a liquid crystal layer that covers the pixel electrode structure. The pixel electrode structure and capacitor electrode structure may be electrically coupled by a conductive via structure that extends through the display layers without contacting the common electrode structure. The conductive via structure may contact underlying transistor structures such as a source-drain structure.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, 3, and 4.

Figure 1:
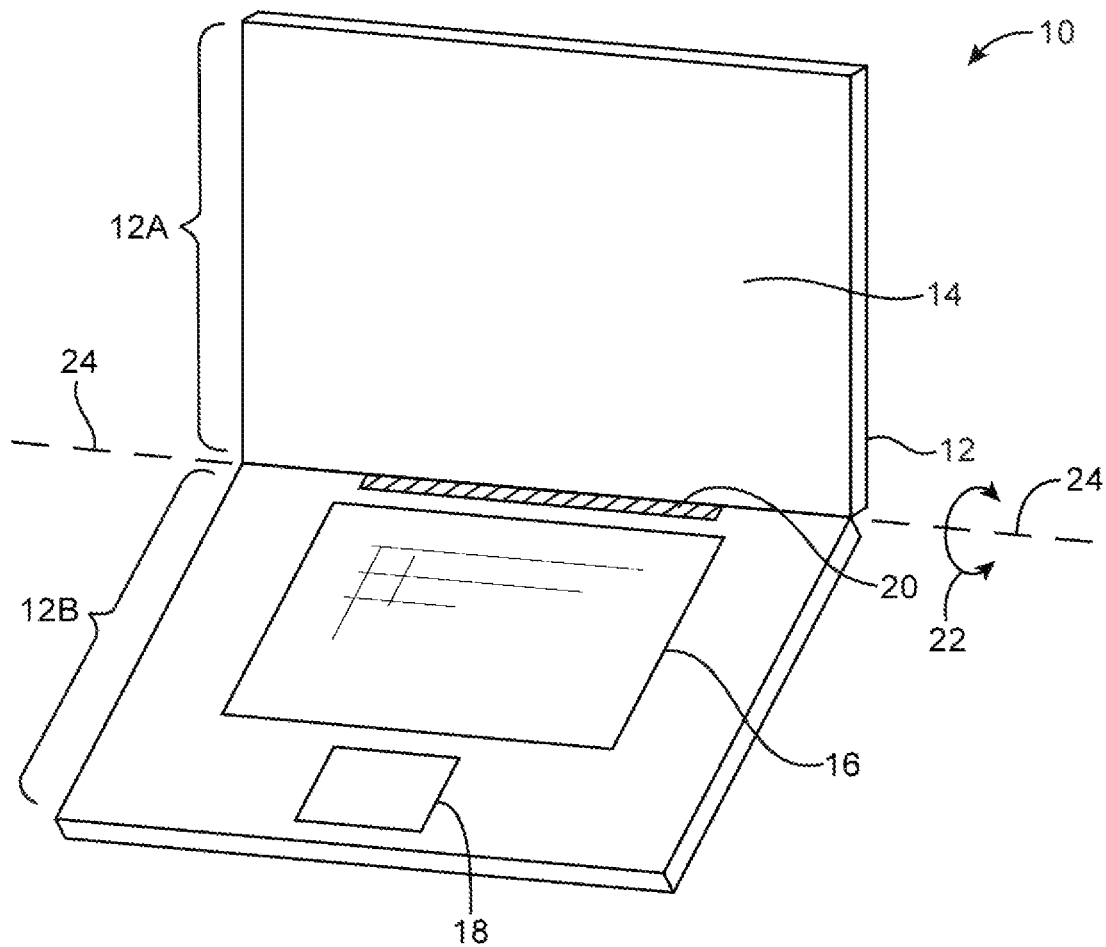
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
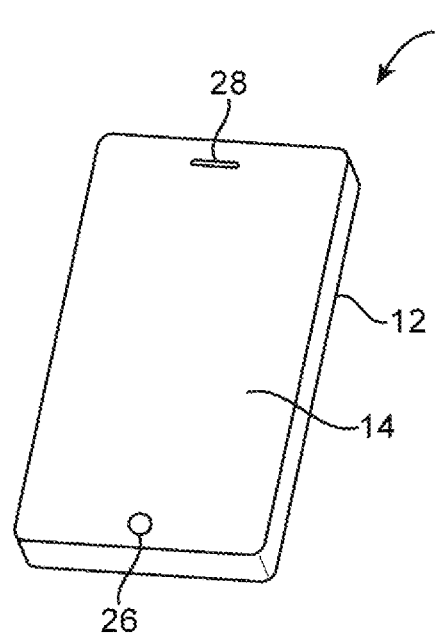
FIG. 2 is a perspective view of an illustrative electronic device such as a handheld electronic device with a display in accordance with an embodiment of the present invention.

FIG. 2 shows now electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
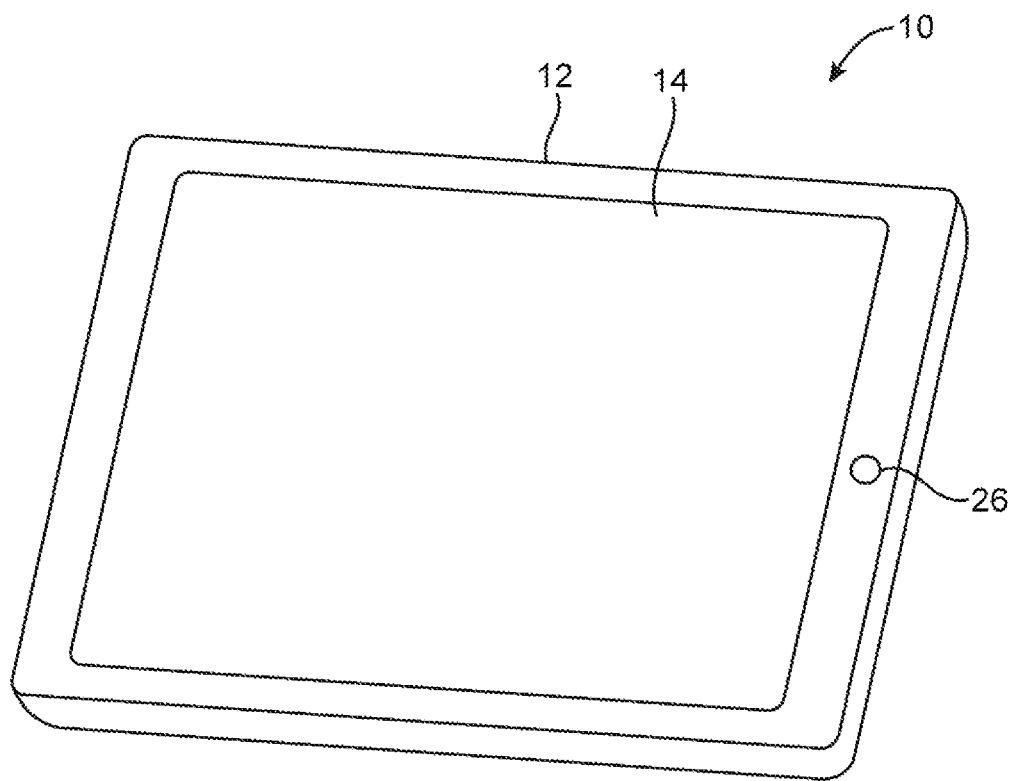
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
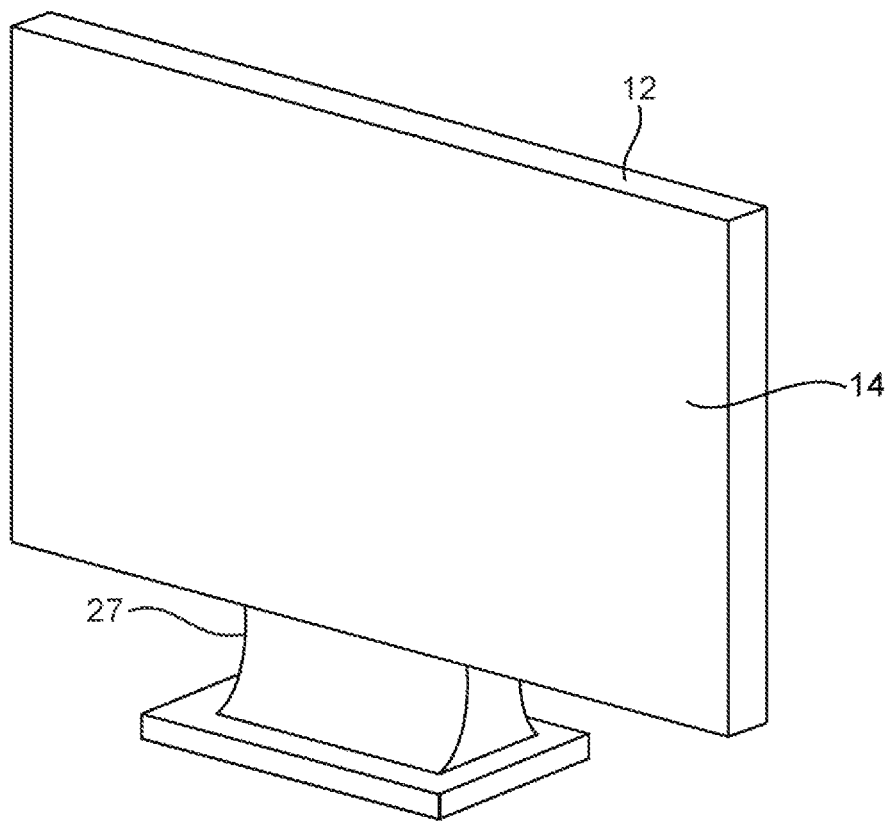
FIG. 4 is a perspective view of an illustrative electronic device such as a computer display with display structures in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may foe formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable image pixel structures.

A display cover layer may cover the surface of display 14 or a display layer such as a color filter layer or other portion of a display may be used as the outermost (or nearly outermost) layer in display 14. The outermost display layer may foe formed from a transparent glass sheet, a clear plastic layer, or other transparent member.

Figure 5:
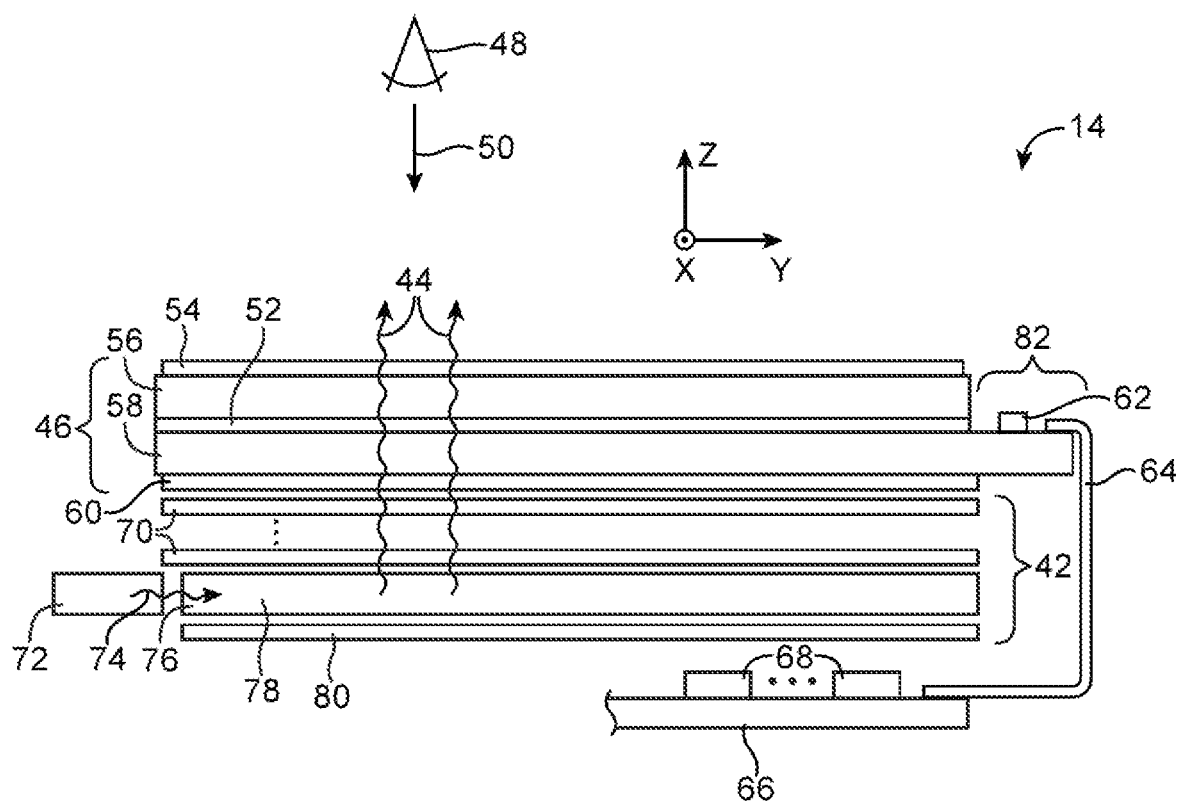
FIG. 5 is a cross-sectional side view of an illustrative display in accordance with an embodiment of the present invention.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z In the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits such as components 68 on printed circuit 66 of FIG. 5) may be used to generate information to be displayed on display 14 (e.g., display data). The information to be displayed may be conveyed from circuitry 68 to display driver integrated circuit 62 using a signal path such as a signal path formed from conductive metal traces in flexible printed circuit 64 (as an example).

Display driver integrated circuit 52 may be mounted on thin-film-transistor layer driver ledge 82 or elsewhere in device 10. A flexible printed circuit cable such as flexible printed circuit 64 may be used in routing signals between printed circuit 66 and thin-film-transistor layer 58. If desired, display driver integrated circuit 62 may be mounted on printed circuit 66 or flexible printed circuit 64. Printed circuit 66 may be formed from, a rigid printed circuit board (e.g., a layer of fiberglass-filled epoxy) or a flexible printed circuit (e.g., a flexible sheet of polyimide or other flexible polymer layer).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Figure 6:
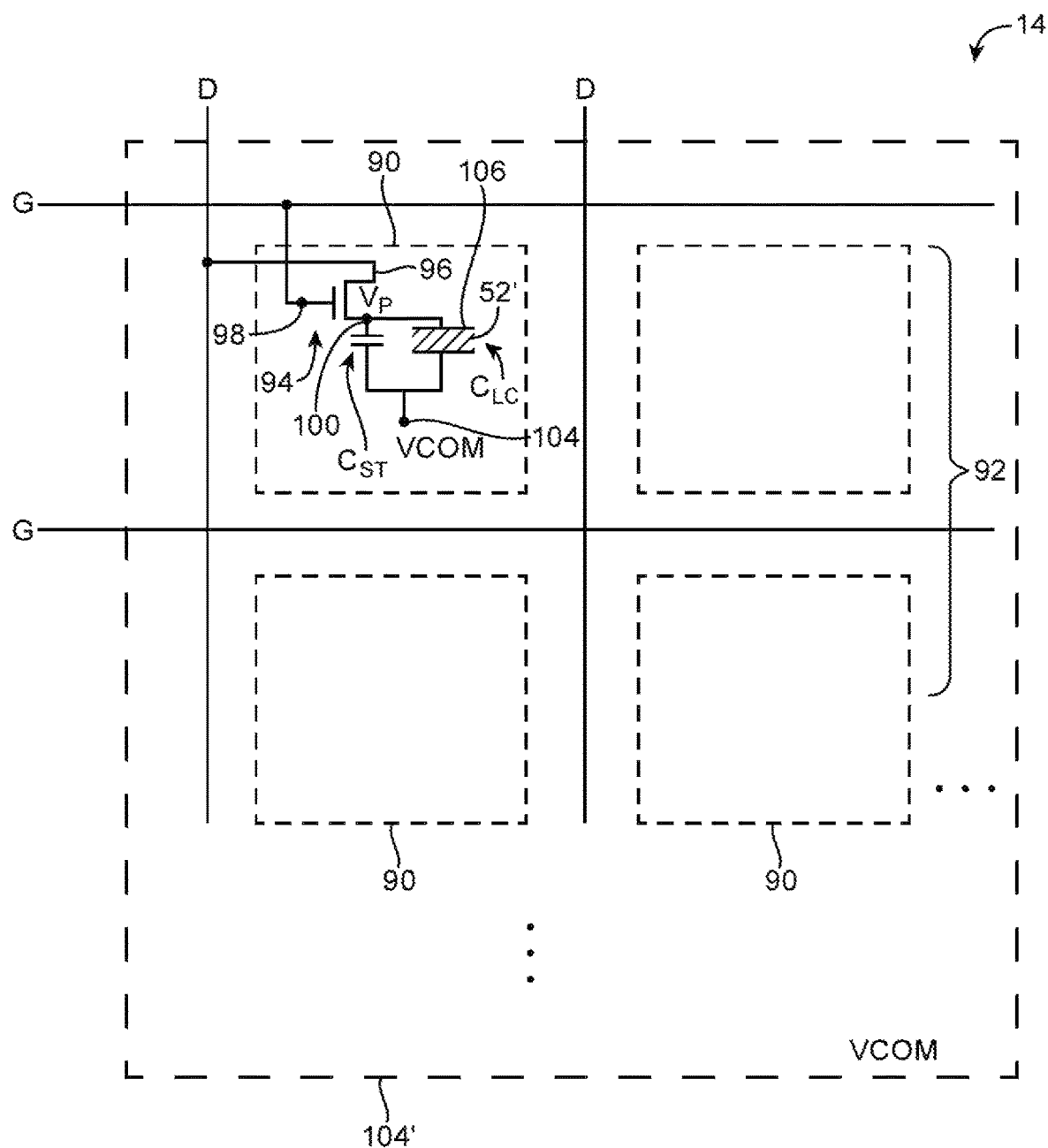
FIG. 6 is a cop view of an illustrative array of display pixels in a display in accordance with an embodiment of the present invention.

As shown in FIG. 6, display 14 may include a pixel array such as pixel array 92. Pixel array 92 may be controlled using control signals produced by display driver circuitry. Display driver circuitry may be implemented using one or more integrated circuits (ICs) and may sometimes be referred to as a driver IC, display driver integrated circuit, or display driver.

During operation of device 10, control circuitry in device 10 such as memory circuits, microprocessors, and other storage and processing circuitry may provide data to the display driver circuitry. The display driver circuitry may convert the data into signals for controlling the pixels of pixel array 92.

Pixel array 92 may contain rows and columns of display pixels 90. The circuitry of pixel array 92 may be controlled using signals such as data line signals on data lines D and gate line signals on gate lines G.

Pixels 90 in pixel array 92 may contain thin-film transistor circuitry (e.g., polysilicon transistor circuitry, indium gallium zinc oxide transistor circuitry, or amorphous silicon transistor circuitry) and associated structures for producing electric fields across liquid crystal layer 52 in display 14. Each display pixel may have a respective thin-film transistor such as thin-film transistor 94 to control the application of electric fields to a respective pixel-sized portion 52' of liquid crystal layer 52.

The thin-film transistor structures that are used in forming pixels 90 may be located on a thin-film transistor substrate such as a layer of glass. The thin-film transistor substrate and the structures of display pixels 90 that are formed on the surface of the thin-film transistor substrate collectively form thin-film transistor layer 58 (FIG. 5).

Gate driver circuitry may be used to generate gate signals on gate lines G. The gate driver circuitry may be formed from thin-film transistors on the thin-film transistor layer or may be implemented in separate integrated circuits. Gate driver circuitry may be located on both the left and right sides of pixel array 92 or on one side of pixel array 92 (as examples).

The data line signals on data lines D in pixel array 92 carry analog image data (e.g., voltages with magnitudes representing pixel brightness levels). During the process of displaying images on display 14, a display driver integrated circuit may receive digital data from control circuitry and may produce corresponding analog data signals. The analog data signals may be demultiplexed and provided to data lines D.

The data line signals on data lines D are distributed to the columns of display pixels 90 in pixel array 92. Gate line signals on gate lines G are provided to the rows of pixels 90 in pixel array 92 by associated gate driver circuitry.

The circuitry of display 14 such as demultiplexer circuitry, gate driver circuitry, and the circuitry of pixels 90 may be formed from conductive structures (e.g., metal lines and/or structures formed from transparent conductive materials such as indium tin oxide) and may include transistors such as transistor 94 that are fabricated on the thin-film transistor substrate layer of display 14. The thin-film transistors may be, for example, polysilicon thin-film transistors or amorphous silicon transistors.

As shown in FIG. 6, pixels such as pixel 90 may be located at the Intersection of each gate line G and data line D in array 92. A data signal on each data line D may foe supplied to terminal 96 from one of data lines D. Thin-film transistor 94 (e.g., a thin-film polysilicon transistor or an amorphous silicon transistor) may have a gats terminal such as gate 98 that receives gate line control signals on gate line signal path G. When a gate line control signal is asserted, transistor 94 will be turned on and the data signal at terminal 96 will be passed to node 100 as voltage Vp. Data for display 14 may be displayed in frames. Following assertion of the gate line signal in each row to pass data signals to the pixels of that row, the gate line signal may be deasserted. In a subsequent display frame, the gate line signal for each row may again be asserted to turn on transistor 94 and capture new values of Vp.

Pixel 90 may nave a signal storage element such as a capacitor having capacitance $C_{ST}$ or other charge storage element. The storage capacitor may be used to store signal Vp in pixel 90 during and/or between frames (e.g., in the period of time between the assertion of successive gate signals).

Display 14 may have a common electrode coupled to node 104. The common electrode (which is sometimes referred to as the Vcom electrode) may be used to distribute a common electrode voltage such as common electrode voltage Vcom to nodes such as node 104 in each pixel 90 of array 92. As shown by illustrative electrode pattern 104' of FIG. 6, Vcom electrode 104 may be implemented using a blanket film of a transparent conductive material such as indium tin oxide (e.g., electrode 104 may be formed from, a layer of indium tin oxide that covers substantially all of pixels 90 in array 92). If desired, electrode 104 may be partitioned into separate portions that each covers a respective group of pixels 90 in array 92.

In each pixel 90, capacitance $C_{ST}$ may be formed between nodes 100 and 104. A parallel capacitance arises across nodes 100 and 104 due to electrode structures in pixel 90 that are used in controlling the electric field through the liquid crystal material of the pixel (liquid crystal material 52'). As shown in FIG. 6, electrode structures 106 may be coupled to node 100. Capacitance $C_{LC}$ across liquid crystal material 52' is associated with the capacitance between electrode structures 106 and common electrode Vcom at node 104. During operation, electrode structures 106 may be used to apply a controlled electric field (i.e., a field having a magnitude proportional to Vp-Vcom) across pixel-sized liquid crystal material 52' in pixel 90. Due to the presence of storage capacitance $C_{ST}$ and capacitance $C_{LC}$ across liquid crystal material 52', the value of Vp (and therefore the associated electric field across liquid crystal material 52') may be maintained across nodes 106 and 104 for the duration of the frame.

The electric field that is produced across liquid crystal material 52' causes a change in the orientations of the liquid crystals in liquid crystal material 52'. This changes the polarization of light passing through liquid crystal material 52'. The change in polarization may, in conjunction with polarizers 60 and 54 of FIG. 4, be used in controlling the amount of light 44 that is transmitted through each pixel 90 in array 92 of display 14.

Figure 7:
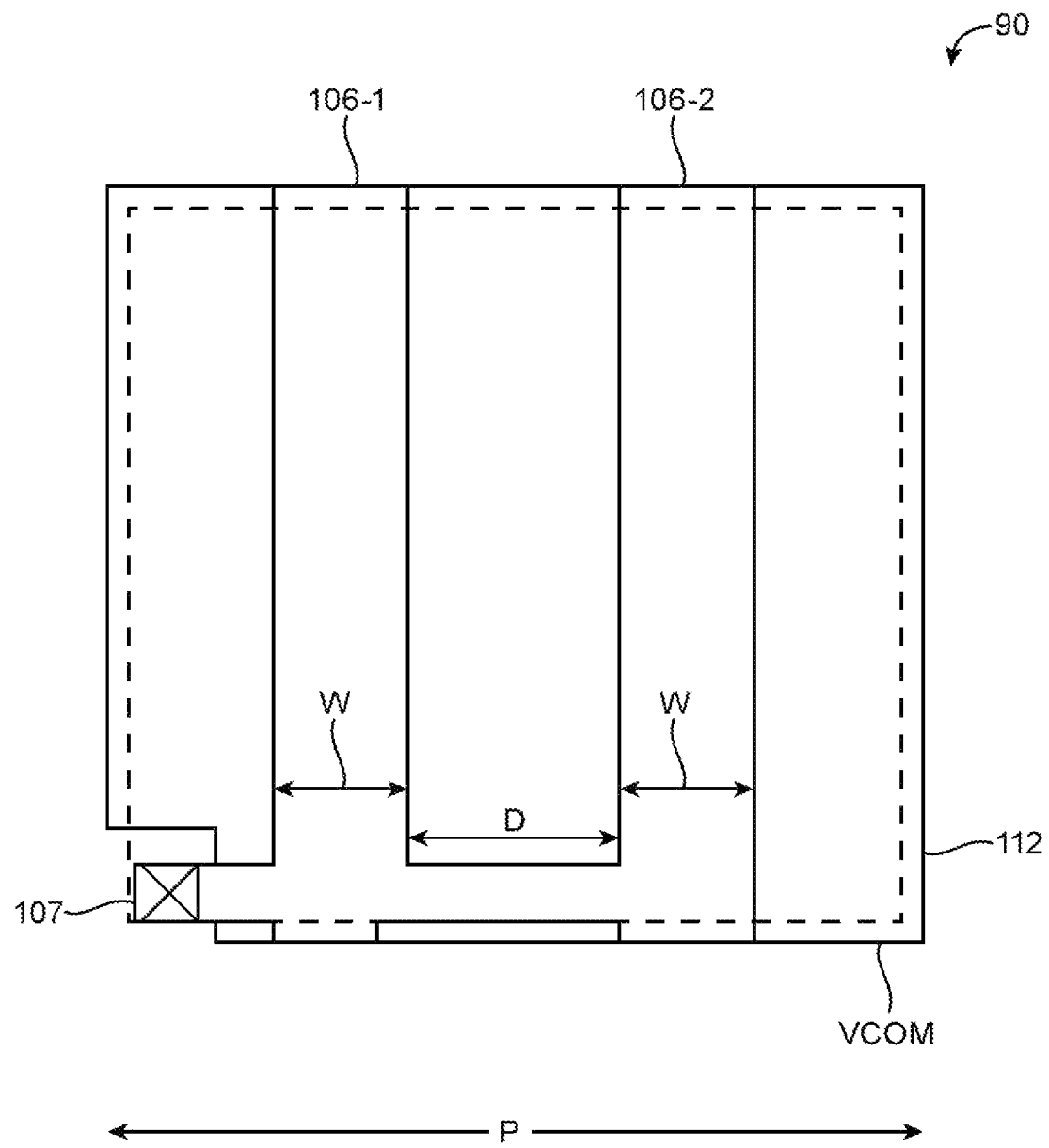
FIG. 7 is a top view of an illustrative display pixel having pixel finger structures and increased storage capacitance in accordance with an embodiment of the present invention.

As shown in FIG. 7, pixel 90 may include electrode structures 106-1 and 106-2 that are formed in parallel. The electrode structures may have lengths that extend substantially across the pixel (e.g., the active area of the pixel through which light is emitted) and may sometimes be referred to as electrode fingers or pixel fingers. Each pixel finger may have a width W and may be separated from an adjacent pixel finger by distance D. For example, pixel finger 106-1 may be separated from adjacent pixel finger 106-2 by distance D. Width W may be about 3 μm, whereas distance D may be about 5 μm (as examples). Width W and distance D may be determined so that pixel fingers 106 form desired field lines to underlying common electrode Vcom. For example, the ratio between width W and distance D may be required to be greater than or equal to a threshold value (e.g., a ratio of 3 μm to 5 μm).

The storage capacitance between electrodes 106 and underlying common electrode Vcom may be constrained by the area of pixel fingers 106. As display resolution increases, the pixel pitch F decreases. For example, at high display resolutions, the pixel pitch P may be 16 μm or less. At a pixel pitch of 16 μm, only two pixel fingers 106 may be formed while satisfying minimum width-to-distance constraints. However, the area of two pixel fingers 106 may be insufficient to provide a desired amount of capacitance $C_{ST}$. To provide an Increased amount of capacitance $C_{ST}$, an electrode layer 112 may be formed under common electrode Vcom. Electrode layer 112 may be electrically coupled (e.g., shorted) to pixel fingers 106 by a conductive via structure 107 and serve to increase the parallel plate capacitance that forms $C_{ST}$. Electrode layer 112 may have an area that is substantially the same as pixel 90 or may have any desired area or shape. Conductive via structure 107 may be formed through an opening in the common electrode Vcom so that via structure 107 electrically couples pixel electrode structures (e.g., fingers 106) to electrode layer 112 without contacting common electrode Vcom.

Figure 8:
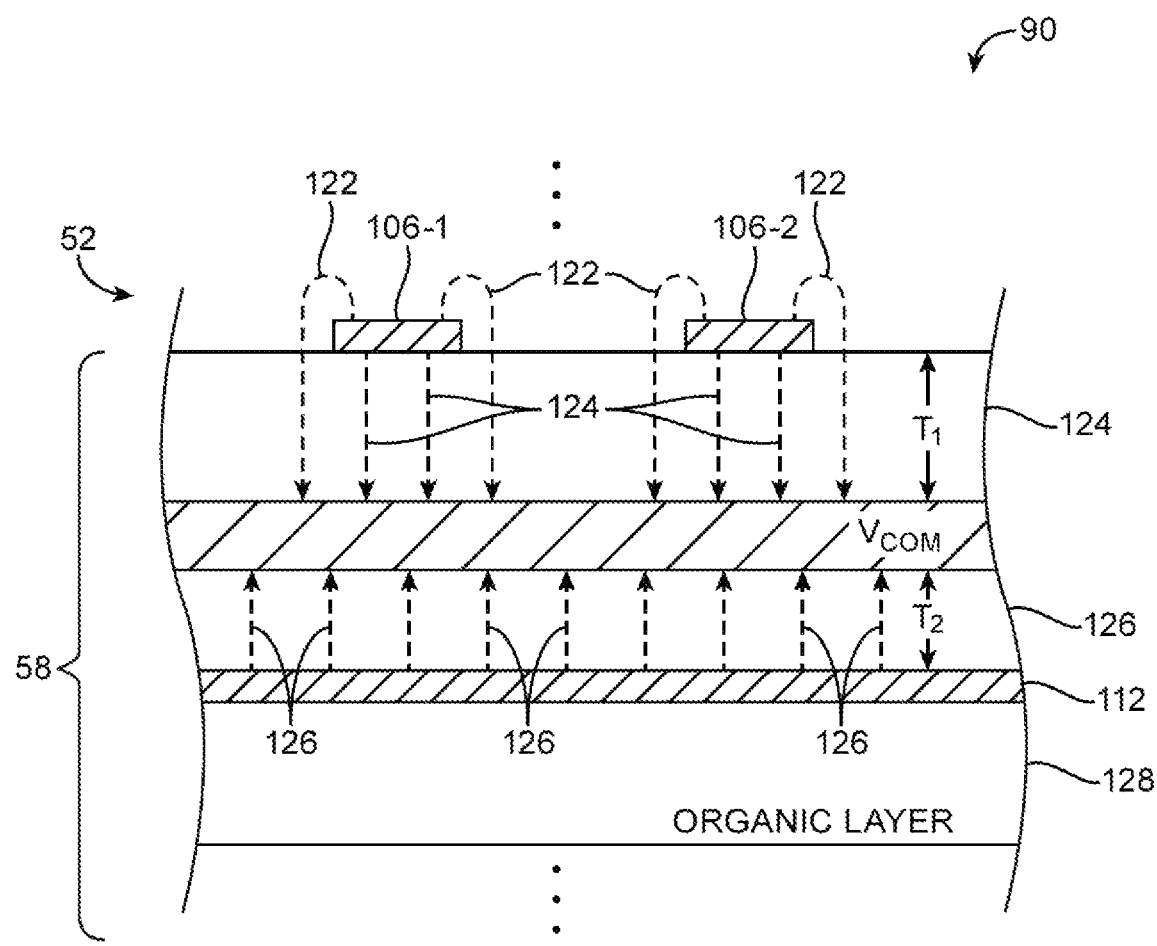
FIG. 8 is a cross-sectional view of an illustrative display pixel having pixel finger structures and increased storage capacitance in accordance with an embodiment of the present invention.

FIG. 8 is an illustrative cross-sectional diagram of a portion of pixel 90 having increased storage capacitance. As shown in FIG. 8, pixel fingers 122 may be separated from common electrode Vcom by passivation layer 124 (e.g., silicon nitride or silicon oxide). During display operations, field lines 122 and 124 may be produced between pixel fingers (e.g., fingers 106-1 and 106-2) and common electrode Vcom. Field lines 122 may contribute to capacitance $C_{LC}$ associated with liquid crystal layer 52. Field lines 124 may contribute to storage capacitance $C_{ST}$ between fingers 106 and common electrode Vcom.

Pixel 90 may Include additional electrode layer 112 that is formed on organic layer 128 underneath common electrode Vcom. During operation of pixel 90, field lines 126 may be formed between electrode layer 112 and common electrode Vcom. Electrode layer 112 may effectively form a parallel plate capacitance with common electrode Vcom that is combined with the parallel plate capacitance between fingers 106 and common electrode Vcom to form storage capacitance $C_{ST}$. Storage capacitance $C_{ST}$ may be adjusted to a desired value. For example, higher storage capacitance may ensure that sufficient charge is held between display frames, whereas lower storage capacitance may ensure that capacitance charging during initial frame operations is sufficiently quick.

Storage capacitance $C_{ST}$ may be determined from the area of fingers 106 that overlaps common electrode Vcom, thickness T1 of passivation layer 124, thickness T2 of passivation layer 126, the area of additional electrode layer 112 that overlaps common electrode Vcom, and the dielectric constant of passivation layers 124 and 126. Storage capacitance $C_{ST}$ may be reduced by reducing the area of fingers 106 (e.g., reducing W or reducing the number of fingers), increasing thickness T1, increasing thickness T2, reducing the area of additional electrode layer 112, reducing the dielectric constant of layer 124, reducing the dielectric constant of layer 126, or any combination of these adjustments. Storage capacitance $C_{ST}$ may be increased by increasing the area of fingers 106 (e.g., increasing W or increasing the number of fingers), reducing thickness T1, reducing thickness T2, increasing the area of additional electrode layer 112, increasing the dielectric constant of layer 124, increasing the dielectric constant of layer 126, or any combination of these adjustments.

The example of FIG. 8 in which the Vcom electrode is interposed between pixel electrodes and additional capacitor electrode 112 is merely illustrative. If desired, the functions of pixel electrode structures 106 and the Vcom electrode structure may be swapped. For example, electrode structures 106 may serve as Vcom electrode structures, whereas the Vcom electrode structure as labeled in FIG. 8 may serve as pixel electrode structures (e.g., provided with pixel signals).

Figure 9:
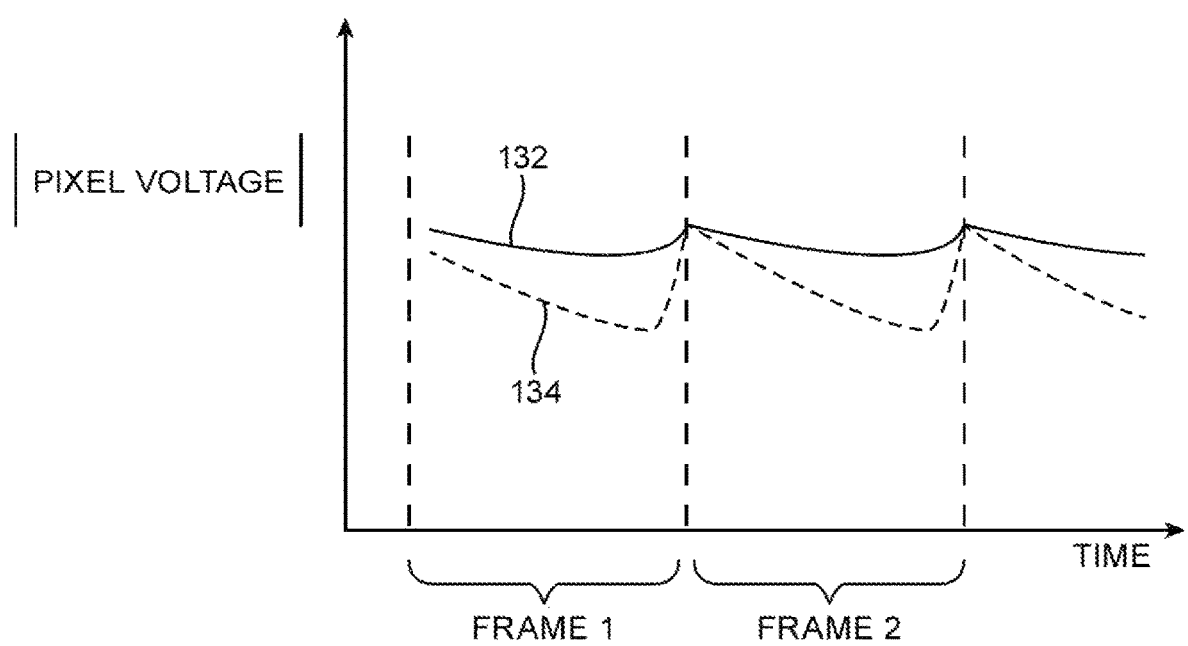
FIG. 9 is a timing diagram showing how a display pixel having Increased storage capacitance may reduce leakage effects in accordance with an embodiment of the present invention.

FIG. 9 is an illustrative timing diagram of absolute pixel voltage over rime during display operations. At the start of each frame (e.g., frame 1, frame 2, etc.), the pixel voltage may be set to a desired voltage. During each frame, the absolute pixel voltage may decrease due to leakage (e.g., transistor leakage). Solid line 132 may represent pixel voltage for pixel 90 having additional electrode layer 112, whereas dashed line 134 may represent pixel voltage for a pixel without additional electrode layer 112. As shown by solid line 132, the pixel voltage of pixel 90 may be maintained at higher levels than the pixel voltage associated with dashed line 134 (e.g., voltage drop due to leakage may be reduced).

Figure 10:
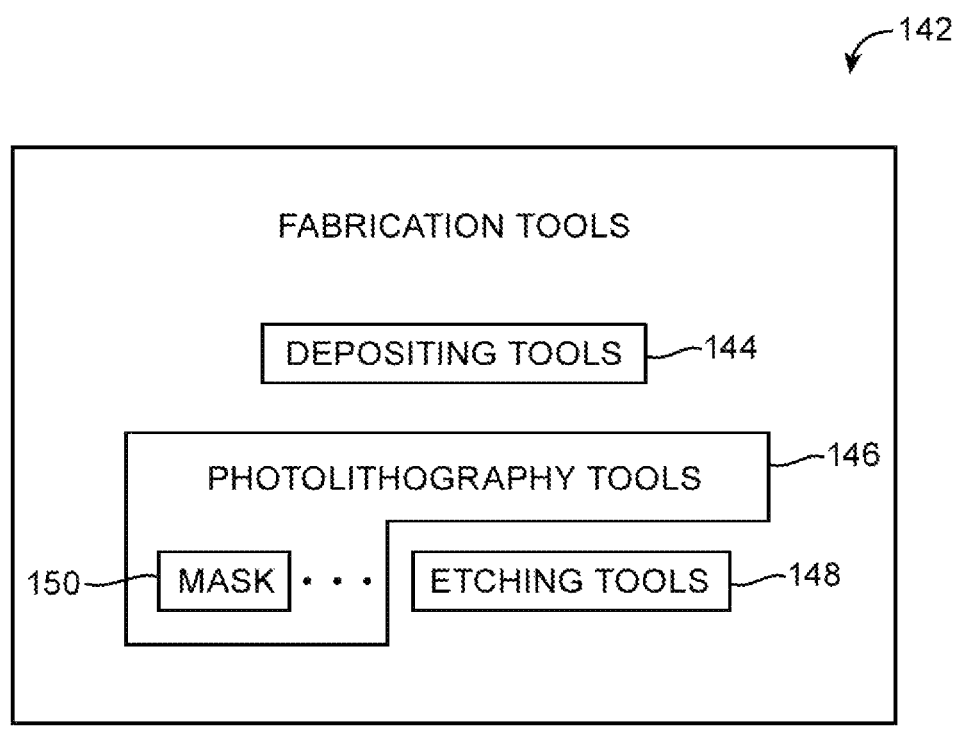
FIG. 10 is a diagram of illustrative fabrication tools that may be used to manufacture a display having display pixels with increased storage capacitance in accordance with an embodiment of the present invention.

FIG. 10 is a diagram of illustrative fabrication tools 142 that may be used to manufacture a display with pixels having increased storage capacitance. As shown in FIG. 10, fabrication tools 142 may include depositing tools 144, photolithography tools 146, and etching tools 143. Depositing tools 34 may include tools for sputtering, performing atomic layer deposition (ALD), molecular beam epitaxy (MBE), electrochemical deposition (ECD), chemical vapor deposition (CVD), physical vapor deposition (PVD), ion implantation tools, etc. Depositing tools 34 may be used to deposit conductive layers, dielectric layers, etch stop layers, or other materials on a display substrate such as glass. Photolithography tools 128 may be used to apply one or more photoresist masks 150 over the display substrate (e.g., to pattern one or more layers of material on the display substrate). Masks 150 may, for example, define regions of material that should be removed (e.g., using etching tools 40) and regions of material that should be maintained. Etching tools 40 may, for example, include wet etching tools or dry etching tools. Etching tools 40 may be used to remove photoresist material, conductive layers, dielectric layers, or other materials on the display.

Figure 11A:
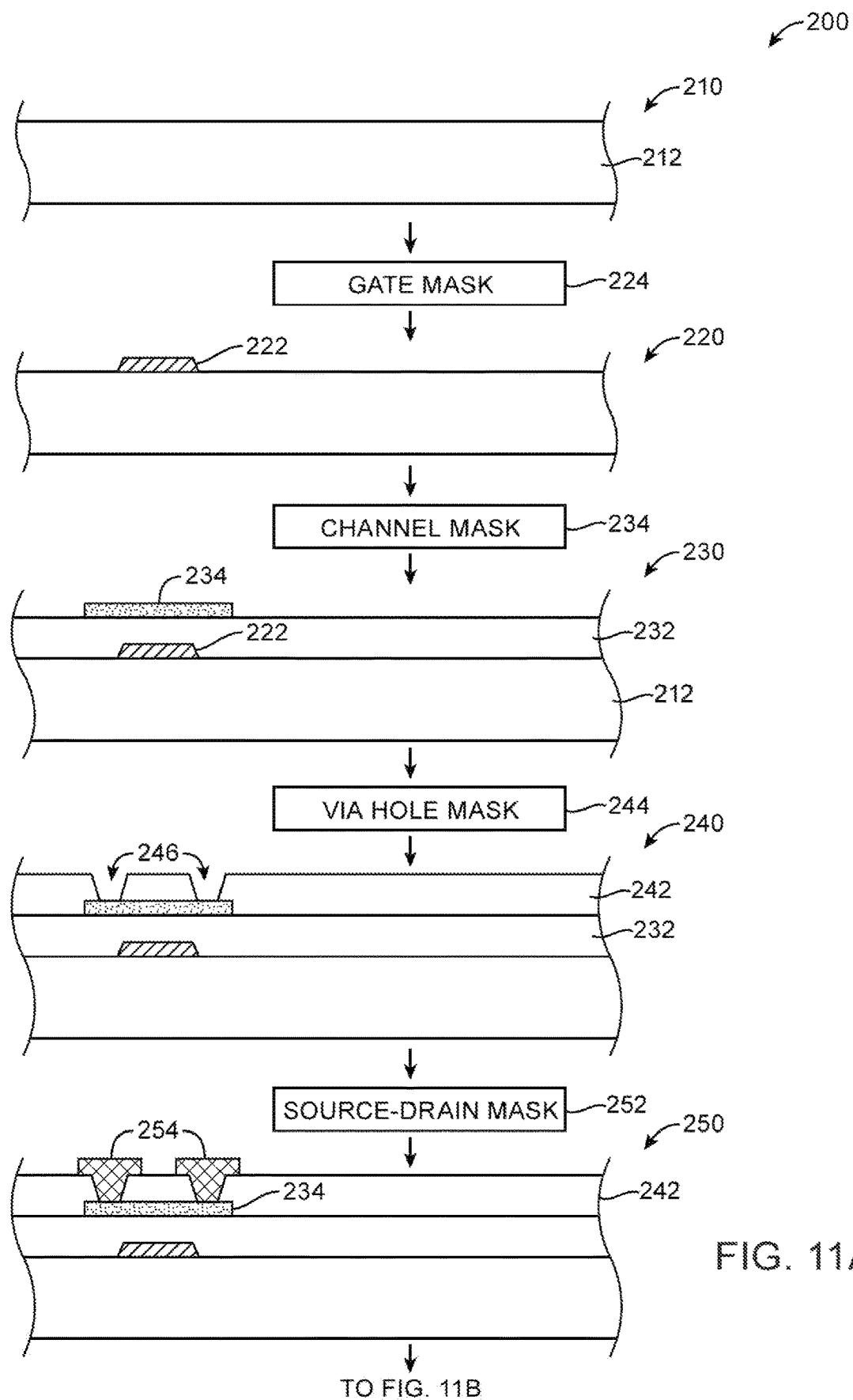
FIGS. 11A-11C show a flow diagram of illustrative steps that may be performed using fabrication tools to manufacture a display having display pixels with increased storage capacitance in accordance with an embodiment of the present invention.
Figure 11B:
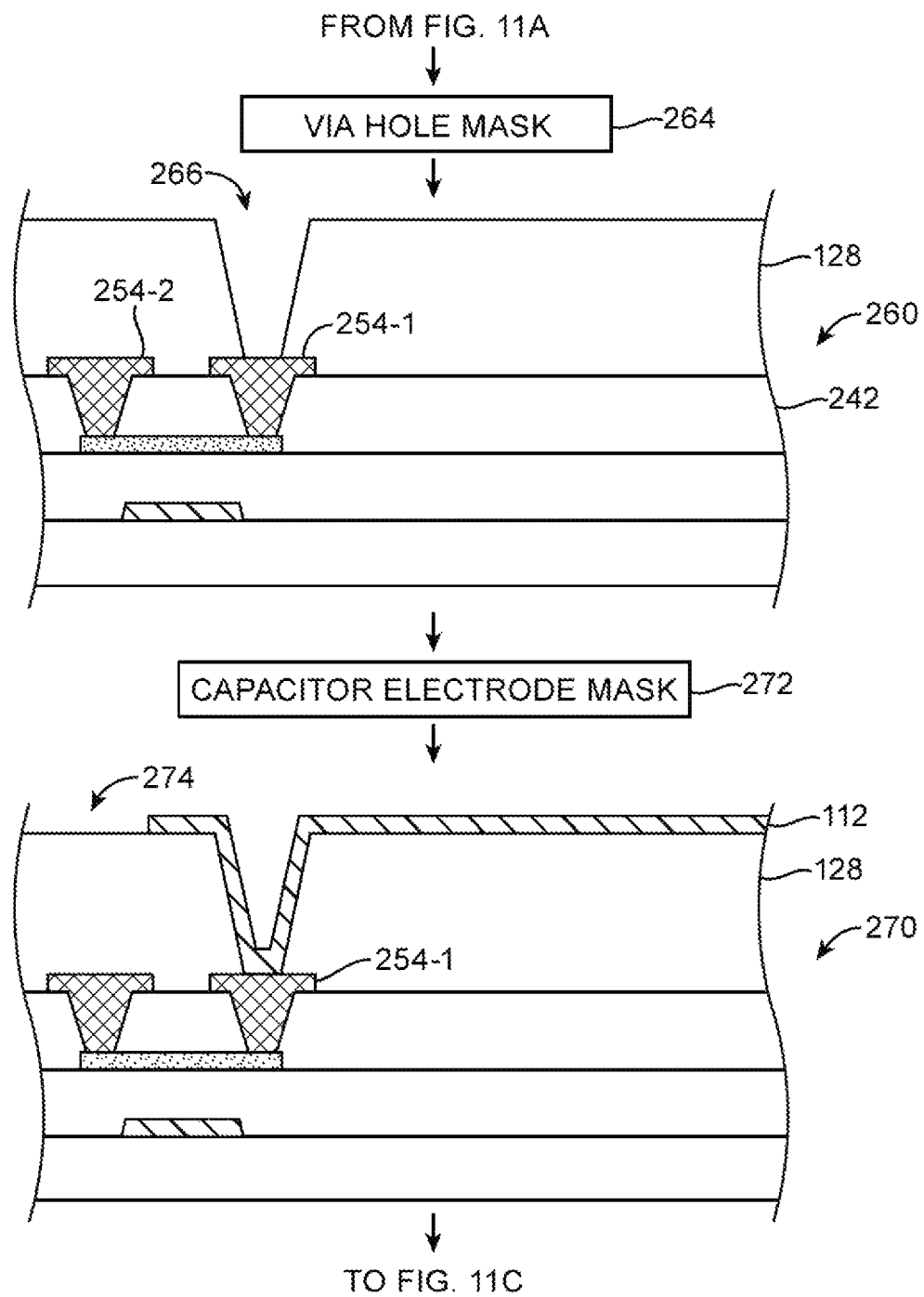
Figure 11C:
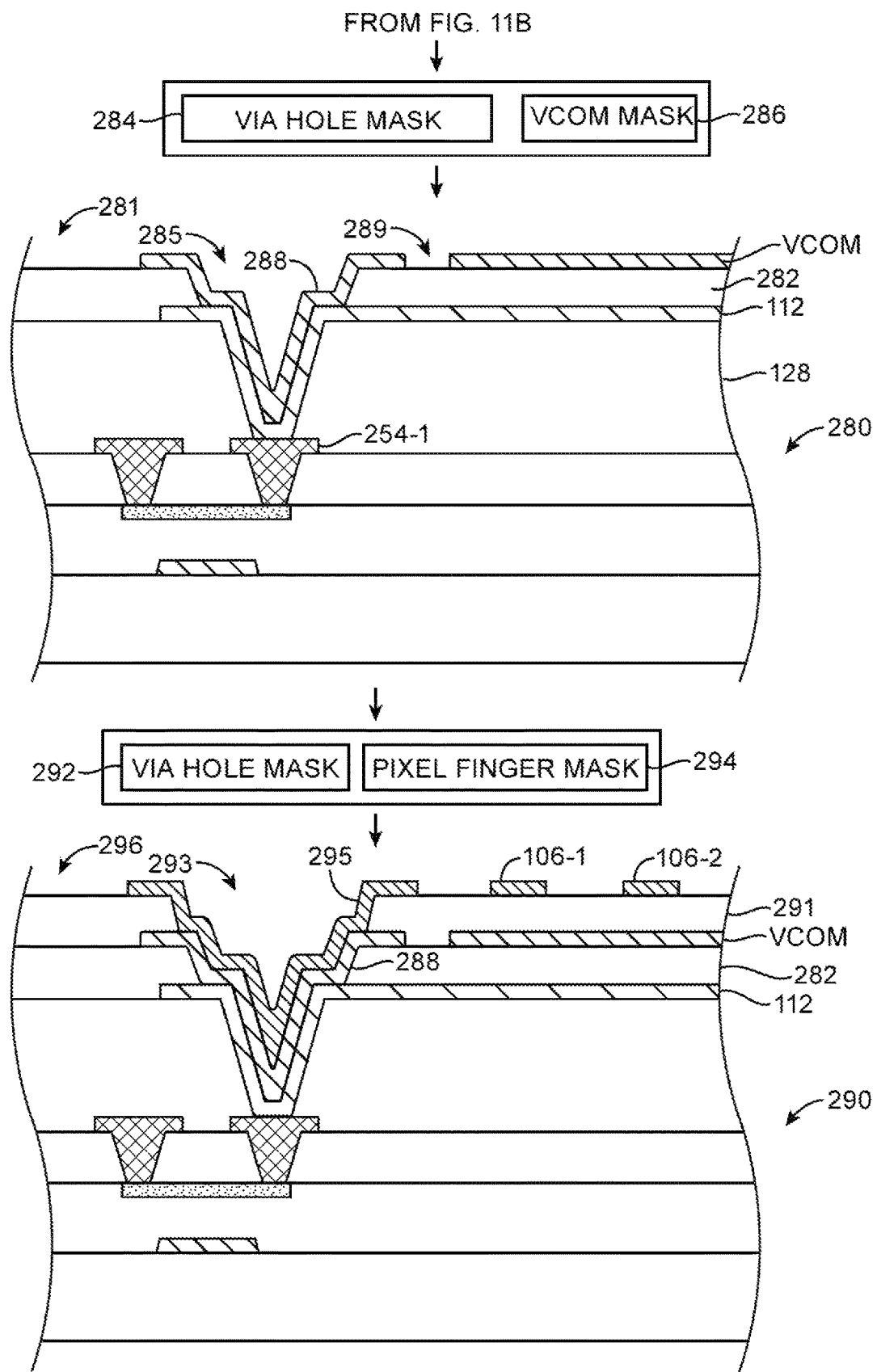

FIGS. 11A, 11B, and 11C show a diagram 200 of illustrative steps that may be performed using fabrication tools 142 to form a display with increased storage capacitance. As shown in FIG. 11A, a display substrate 212 may be provided at initial step 210. Display substrate 212 may be a thin film transistor substrate such as glass.

During step 220, depositing tools 144 may be used to deposit a layer of gate metal such as aluminum, other metals, metal alloys, or other desired conductive materials. The conductive materials may be opaque or, if desired, may be transparent. Photolithography tools 146 may be used to apply a gate mask 224 that defines gate electrode 222. Excess gate metal materials may be removed using etching tools 148 (e.g., gate metals not covered by the gate mask).

During step 230, a dielectric layer 232 may be deposited using depositing tools 144 over gate electrode 222 and substrate 212. A semiconductor layer such as amorphous silicon or indium gallium zinc oxide may be deposited and patterned using a channel mask 234 to form channel structure 234 (e.g., using depositing tools 144, photolithography tools 146, and etching tools 148).

During step 240, a passivation layer 242 may be deposited over channel structures 234 and dielectric layer 232. Passivation layer 242 may be a layer of dielectric materials such as silicon nitrides or silicon oxides. A via hole mask 244 may be used to form via openings 246 that extend through passivation layer 242.

During step 250, metal material such as aluminum or other materials similar to gate electrode 222 may be deposited over passivation layer 242 and patterned using source-drain mask 252 to form source-drain structures 254. The layer of metal may fill via holes 246 so that source-drain structures 254 are electrically coupled to and contact channel structure 234.

During step 260, an organic layer 128 may be deposited over source-drain structures 254. The organic layer may be formed from acrylics or other organic materials. Via hole 266 may be formed over source-drain contact 254-1 in organic layer 128.

During step 270, a layer of conductive material may be deposited over organic layer 128. The layer of conductive material may fill at least a portion of via hole 266 and may contact source-drain structure 254-1. The conductive material may be a transparent conductive material such as indium tin oxide (ITO) to pass light from underlying display backlight structures. The layer of conductive material may be patterned using a capacitor electrode mask 272 to form storage capacitor electrode 112. Capacitor electrode mask 272 may define openings 274 between electrode 112 and adjacent pixels so as to avoid electrical shorting between storage capacitors of adjacent pixels.

During step 280, a passivation layer 282 may be deposited and a via hole mask 284 may be used to form a via hole 285 in passivation layer 282 (e.g., similar to via hole 266 formed in organic layer 128). A transparent conductive layer similar to layer 112 may be subsequently deposited in opening 285 and over passivation layer 282. The transparent conductive layer may be patterned using Vcom mask 286 to form a common electrode Vcom (a first portion) and a second, via portion 288 that is separated from the common electrode Vcom by gap 289. Gap 289 may help to ensure that common electrode Vcom is electrically isolated from transistor structures such as source-drain structure 254-1. Portion 288 of the transparent conductive layer contacts and is electrically coupled to capacitor electrode layer 112. Vcom mask 286 may additionally define one or more gaps 281 that separate the conductive layer from adjacent pixels (e.g., electrically isolating the Vcom electrode and transistor structures from adjacent pixels).

During step 290, a passivation layer 291 may be deposited and a via hole mask 292 may be used to form via hole 293 in passivation layer 291 (e.g., similar to via hole 266 and 285). A transparent conductive layer (e.g., a layer of ITO) may be subsequently deposited in opening 293 and over passivation layer 291. The transparent conductive layer may be patterned using pixel finger mask 294 to form pixel fingers 106-1 and 106-2 and a via portion 295. Via portion 295 may foe electrically isolated from adjacent pixels by gap 296. Via portion 295 may be electrically coupled to pixel fingers 106-1 and 106-2 (e.g., using metal traces on other portions of passivation layer 291). Via portions 295 and 288 electrically couple (e.g., short) pixel fingers to capacitor electrode 112 without electrically shorting to common electrode Vcom.

Figure 12A:
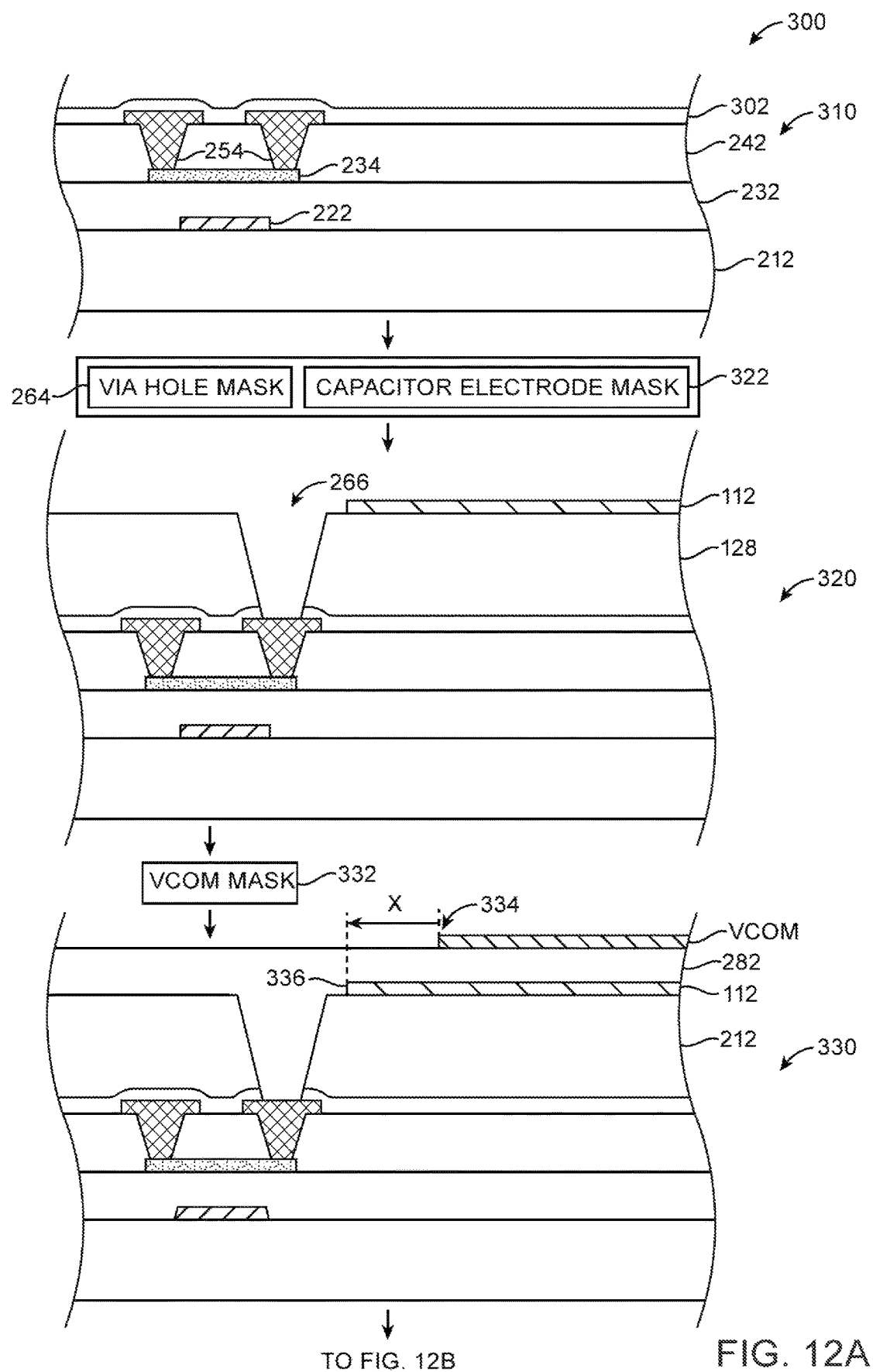
FIGS. 12A and 12B show a flow diagram of illustrative steps that may be performed using fabrication tools to manufacture a display having display pixels with increased storage capacitance using a reduced number of masks in accordance with an embodiment of the present invention.
Figure 12B:
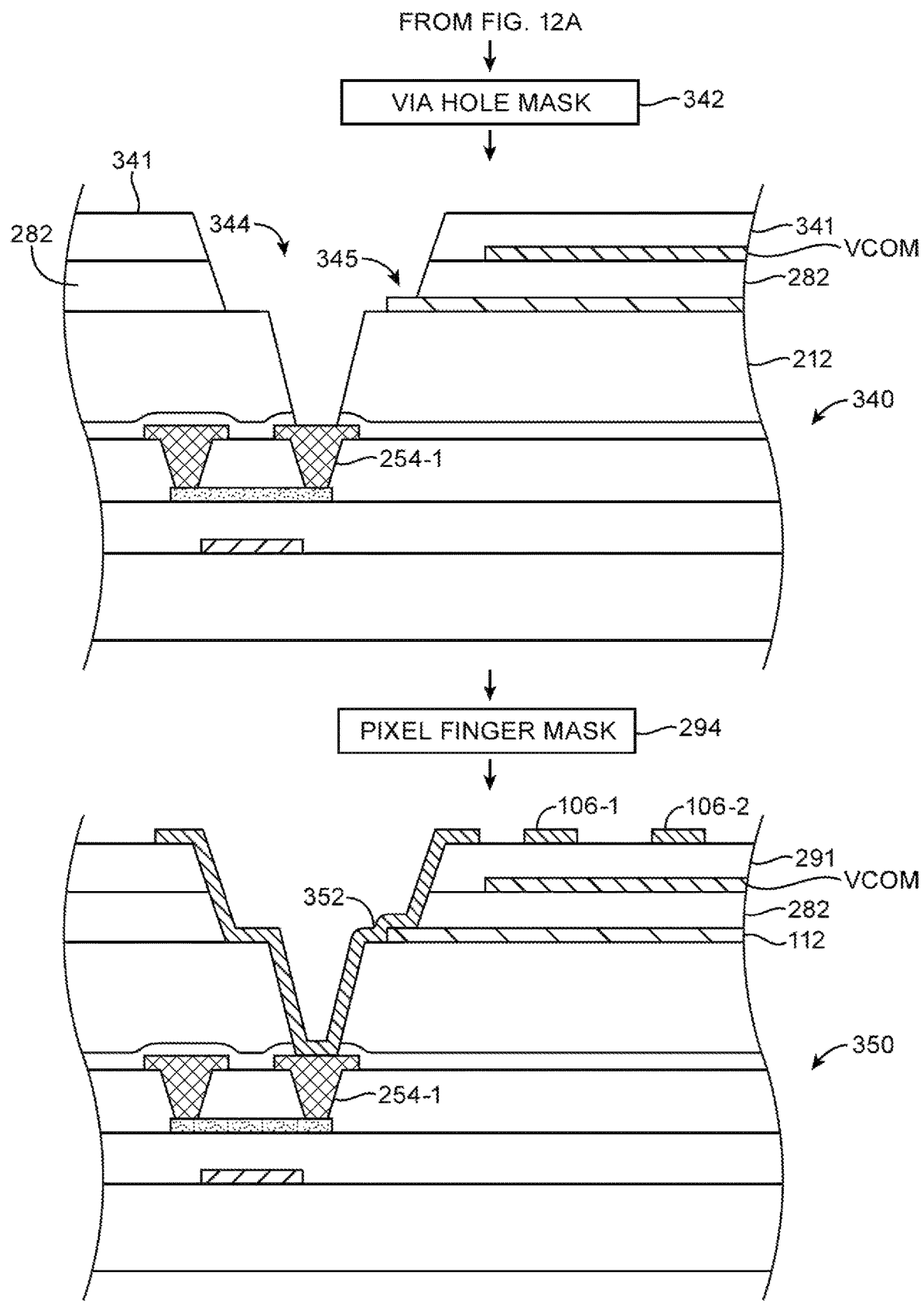

If desired, one or more steps of flow diagram 200 may be omitted to reduce manufacturing complexity and cost. For example, one or more masks used in the steps of flow diagram 200 may be omitted. FIGS. 12A, 12B, and 12C show a flow diagram of illustrative steps that may be performed with a reduced number of masks. Subsequent to formation of thin film transistor structures (e.g., by performing steps 210-250 of FIG. 11A), an optional protection layer 302 may be deposited over the thin film transistor structures and passivation layer 242. Optional protection layer 302 may be formed from similar materials used to form passivation layers (e.g., silicon oxides, silicon nitrides, etc.). Layer 302 may be used to help protect underlying transistor structures from moisture damage. If desired, optional protection layer 302 may be omitted.

During step 320, organic layer 128 may be deposited and via hole mask 264 may be used to form via hole (opening) 266 in the organic layer (e.g., similar to step 260 of FIG. 11B). A layer of transparent conductive material may be deposited and patterned using capacitor electrode mask 322 to form capacitor electrode 112. Capacitor electrode mask 322 may define capacitor electrode 112 so that electrode 112 does not extend over via hole 266 (e.g., mask 322 may expose via hole 266 so that etching tools remove any portion of the transparent conductive layer that is within via opening 266). The example of FIG. 12A is merely illustrative. If desired, capacitor electrode mask 272 of FIG. 11B may be used so that capacitor electrode 112 extends over via opening 266.

During step 330, passivation layer 282 may be deposited over capacitor electrode 112 and organic layer 128. In the example of FIG. 12A, via hole mask 284 of step 280 of FIG. 11C may be omitted. A layer of transparent conductive material may be subsequently deposited and patterned using Vcom mask 332 to form common electrode Vcom. Vcom mask 332 may define common electrode Vcom to leave regions over transistor structures and underlying capacitor electrode 112 exposed. For example, edge 334 of common electrode Vcom may be separated from edge 336 of capacitor electrode 112 by distance X. By exposing regions over underlying transistor structures and underlying capacitor electrode 112, Vcom mask 332 may ensure that subsequent via formation steps do not electrically short common electrode Vcom to the transistor structures or the capacitor electrode.

During step 340, passivation layer 341 may be deposited over common electrode Vcom and passivation layer 282. Via hole mask 342 may be subsequently used to form via opening 344 in passivation layers 341 and 282. A single etching step may be used with via hole mask 342, because passivation layers 341 and 282 may be formed from the same or similar materials. Etching performed using etching tools with via hole mask 342 may expose portion 345 of capacitor electrode 345 and transistor source-drain structure 254-1.

During step 350, a layer of transparent conductive material may be deposited and patterned using pixel finger mask 294 to form via portion 352 and pixel electrodes 106-1 and 106-2 (e.g., similarly to step 290 of FIG. 11C). Via portion 352 may contact, capacitor electrode 112 and source-drain structure 254-1 (e.g., via portion 352 may electrically couple pixel fingers, capacitor electrode 112, and source-drain structure 254-1.

If desired, thin film transistor structures may be formed using polysilicon. FIGS. 13A, 13B, 13C, and 13D show a diagram 400 of illustrative steps that may be performed using fabrication tools to form a display with polysilicon transistor structures and increased storage capacitance.

During step 410, an optional opaque layer (e.g., opaque metal or other opaque materials) may be deposited on substrate 212 and patterned using light shield mask 412 to form light shield structure 414, If desired, step 410 may be omitted.

During step 420, dielectric material 421 may be deposited over light shield structure 414 and substrate 212. Semiconductor material such as polysilicon may be deposited over dielectric material 421 and patterned using channel mask 422 to form channel structure 424 (e.g., similar to channel mask 234 of FIG. 11A). Polysilicon channel structures may be sensitive to light emitted by underlying backlight structures. Channel structure 424 formed from polysilicon may be covered by optional light shield structure 414 to help protect the polysilicon channel structure from underlying backlight structures (e.g., by blocking light from the backlight structures).

During step 430, a passivation layer 432 may be deposited over channel structures 424. A layer of metal or other conductive materials may be deposited over passivation layer 432 and subsequently patterned using gate mask 434 to form gate structure 436. Gate structure 436 may control current, flow through channel 424 during display operation.

During step 440, a passivation layer 442 may be deposited over passivation layer 432 and gate structures 436. A via hole mask 444 may be subsequently used to form via holes 446 that extend through passivation layers 432 and 442 and expose portions of channel structure 424.

During step 450, a layer of metal or other conductive material may be deposited over passivation layer 442 and subsequently patterned using source-drain mask 452 to form source-drain structures 454 that extend through passivation layers 432 and 444 to contact channel structure 424.

Figure 13A:
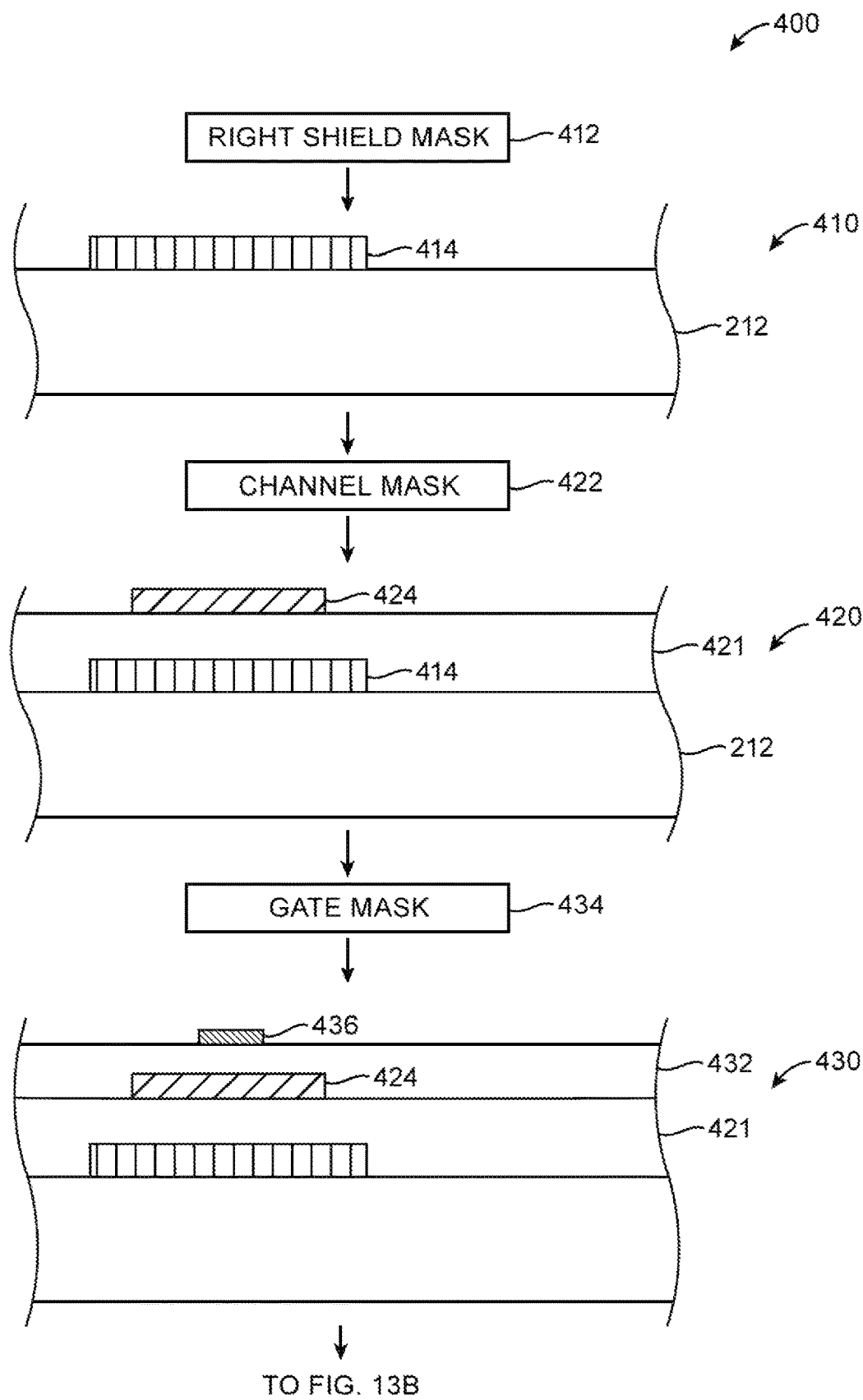
FIGS. 13A-13D show a flow diagram of illustrative steps that may be performed using fabrication tools to manufacture a display having display pixels with polysilicon transistor structures and increased storage capacitance in accordance with an embodiment of the present invention.
Figure 13B:
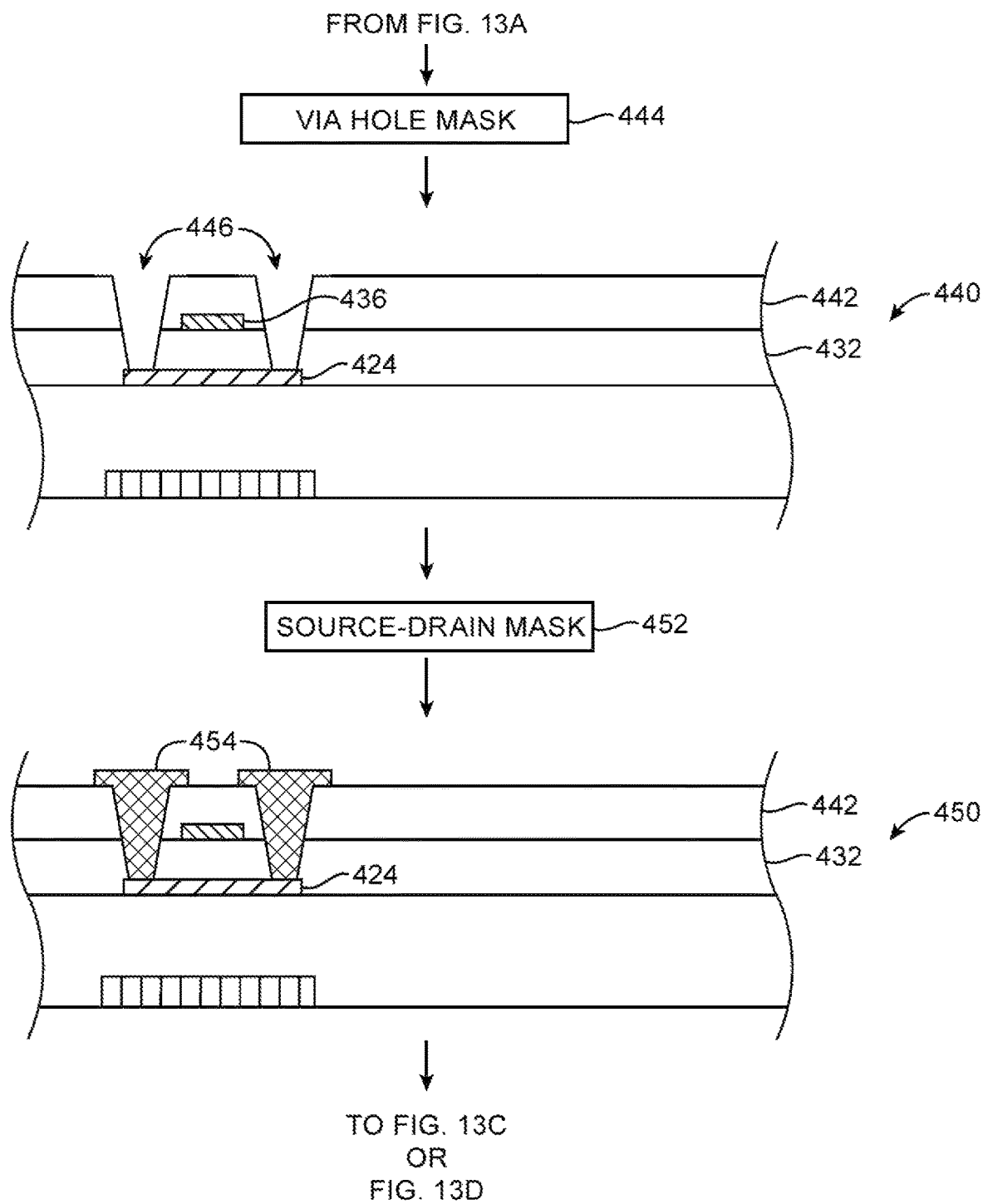
Figure 13C:
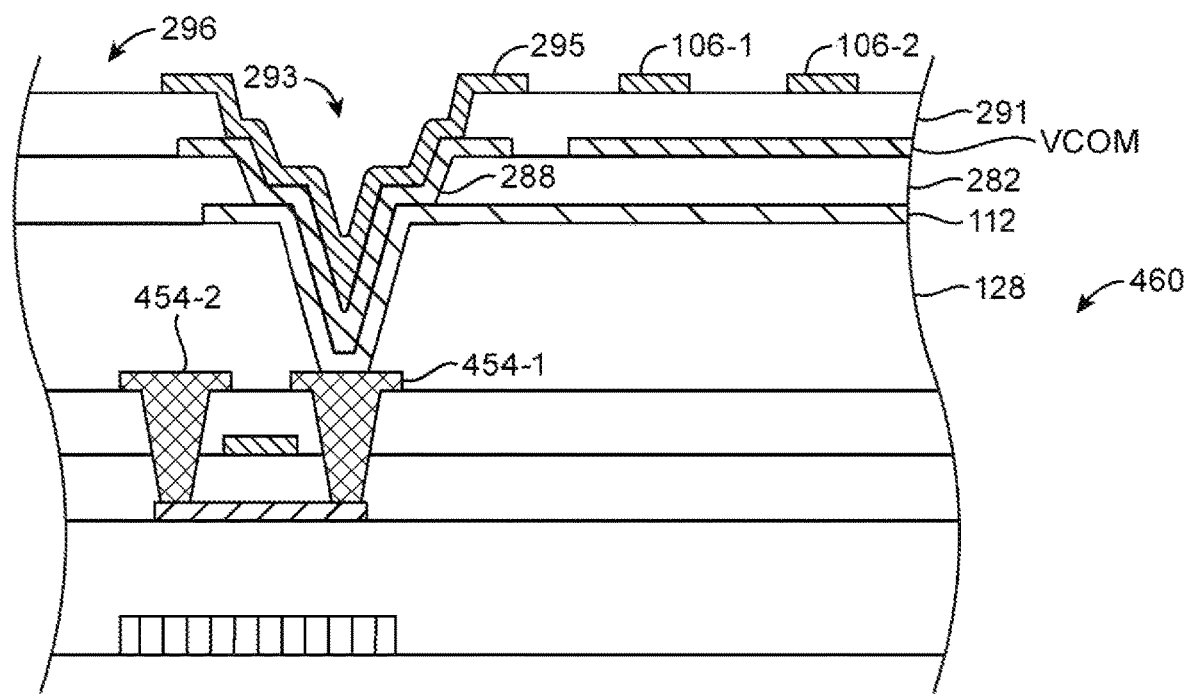
Figure 13D:
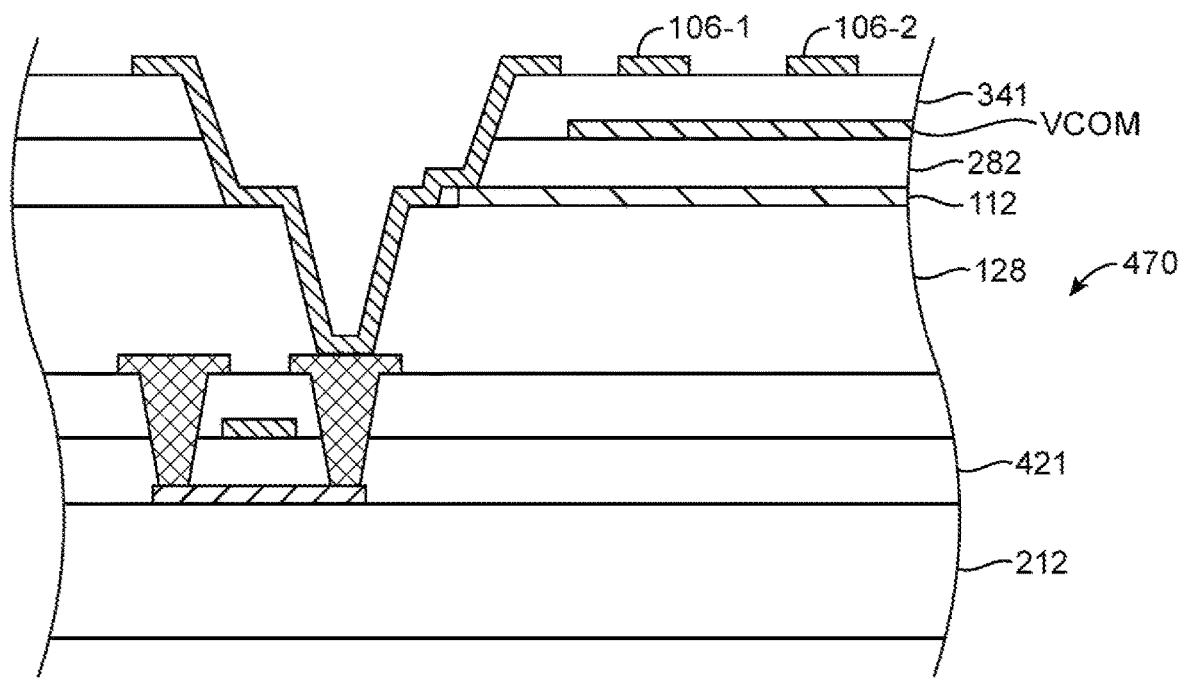

As shown in FIG. 13C, step 460 may be subsequently performed using fabrication tools to form a conductive via structure (e.g., portions 288 and 295) that electrically couples capacitor electrode structure 112, pixel fingers 106, and source-drain structure 454-1. Step 460 may, for example, include steps 260-290 of FIGS. 11B and 11C. If desired, one or more masks may be omitted to reduce complexity and cost. In the example of FIG. 13D, light shield mask 412 and via hole mask 284 may be omitted. In other words, step 410 of FIG. 13B may be omitted and steps 320-350 of FIGS. 12A and 12B may be performed subsequent to step 450 of FIG. 13B (e.g., a single via hole mask 342 may be used to form a via opening through passivation layers 341 and 282).

Figure 14:
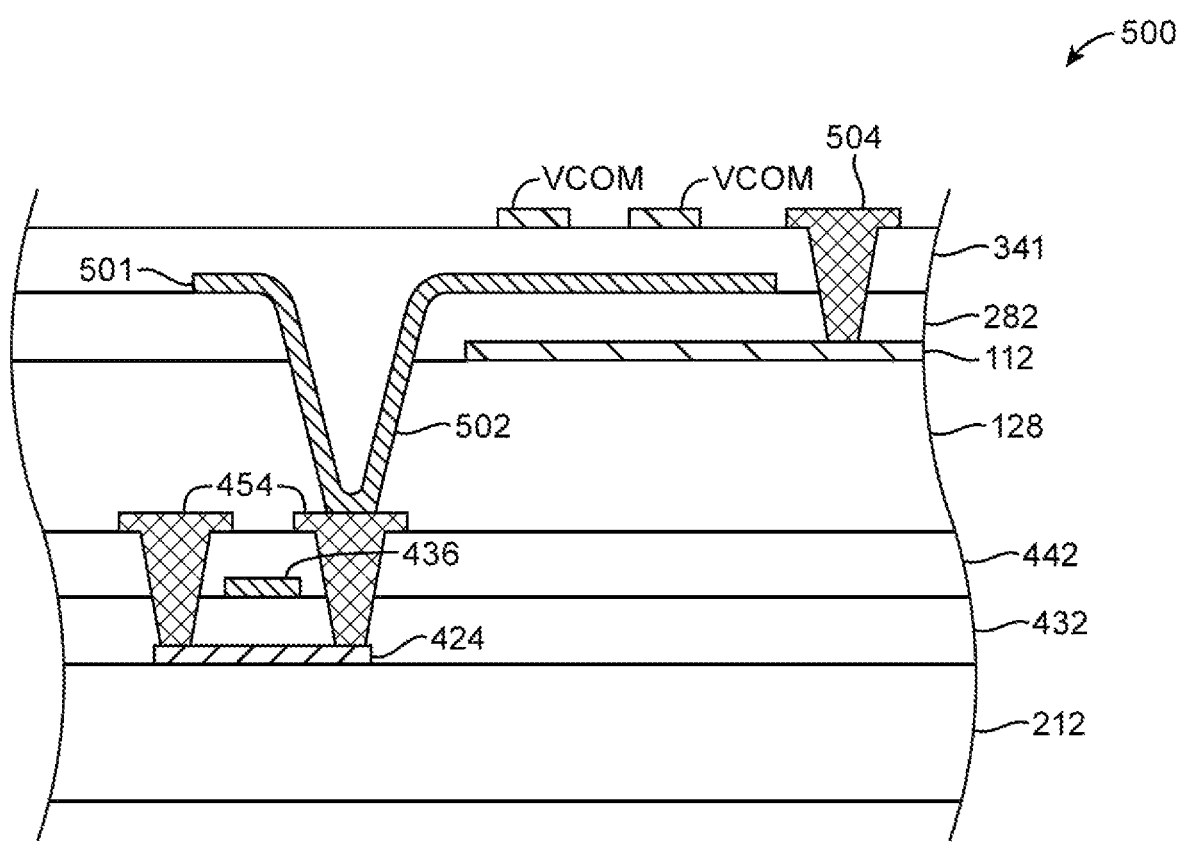
FIG. 14 is an illustrative cross-sectional diagram of a portion of a display having multiple common electrode layers and a pixel electrode interposed between the common electrode layers in accordance with an embodiment of the present invention.

FIG. 14 is an illustrative cross-sectional diagram of a portion of a display in which pixel electrode structures may be interposed between common electrode structures. As shown in FIG. 14, transistor structures (e.g., source-drain structures 454, gate structure 436, and channel structure 424) may be formed on display substrate 212. This example is merely illustrative. If desired, amorphous silicon transistor structures, polysilicon transistor structures, or any desired transistor structures may be formed on display substrate 212.

A capacitor electrode 112 may be formed similarly to FIG. 13D. If desired, capacitor electrode structure 112 may be formed similarly to FIG. 13C. Pixel electrode structures 501 may be formed on passivation layer 282. Via structure 502 may be formed through passivation layer 282 and organic layer 128 to contact source-drain structure 454 without contacting capacitor electrode structure 112. A passivation layer 341 may be deposited over via structure 502 and passivation layer 282, Vcom electrode structures may be formed over passivation layer 341 similarly to pixel electrode structures of FIG. 13D (e.g., the Vcom electrode structures may be patterned, to form fingers). Via structure 504 may be formed to extend through passivation layers 341 and 282 to electrically couple Vcom electrode structures to capacitor electrode structure 112. In the example of FIG. 14, additional capacitance provided between pixel electrode structures 501 and capacitor electrode 112 may provide increased storage capacitance (e.g., in addition to storage capacitance provided between the Vcom electrode structures and pixel electrode structures 501.

The foregoing is merely illustrative of the principles of this invention and various modifications can be made by those skilled in the art without departing from the scope and spirit of the invention.

What is claimed is:

1. A display, comprising:
   a pixel electrode structure for a pixel;
   a capacitor electrode structure that is electrically coupled to the pixel electrode structure, wherein the capacitor electrode structure increases a storage capacitance of the pixel;
   a common electrode layer, wherein the common electrode layer has a transparent portion and wherein the transparent portion is interposed between the pixel electrode structure and the capacitor electrode structure; and
   a source-drain structure that is electrically coupled to the capacitor electrode structure and the pixel electrode structure with a via structure that includes a portion of the pixel electrode structure, wherein the portion of the pixel electrode structure in the via structure overlaps the source-drain structure, and wherein the capacitor electrode structure is interposed between the source-drain structure and the pixel electrode structure.

2. The display defined in claim 1 wherein the display further comprises:
   a common electrode structure in the common electrode layer;
   a display substrate; and
   transistor structures that include the source-drain structure, wherein the transistor structures are formed over the display substrate, and wherein the transistor structures are electrically coupled to the capacitor electrode structure and the pixel electrode structure.

3. The display defined in claim 2 wherein the capacitor electrode structure and the pixel electrode structure form a storage capacitor with the common electrode structure.

4. The display defined in claim 3 further comprising:
an array of pixels, wherein the transistor structures and the storage capacitor forms at least a portion of a pixel of the array of pixels.

5. The display defined in claim 4 wherein the display substrate comprises a glass substrate, wherein the source-drain structure comprises a first source-drain structure, and wherein the transistor structures further comprise:
a second source-drain structure;
a channel structure; and
a gate structure.

6. The display defined in claim 5 further comprising:
a data line that is coupled to the second source-drain structure, wherein the data line conveys a pixel data signal to the second source-drain structure and wherein the storage capacitor stores the pixel data signal.

7. The display defined in claim 6 further comprising a liquid crystal layer that covers the pixel electrode structure.

8. The display defined in claim 3 wherein the pixel electrode structure comprises a plurality of pixel fingers arranged in parallel.

9. The display defined in claim 3
wherein the via structure electrically couples the source-drain structure, the capacitor electrode structure, and the pixel electrode structure without contacting the common electrode structure.

10. A display pixel that receives a pixel data signal, the display pixel comprising:
a common electrode, wherein the common electrode comprises a transparent conductive material;
a pixel electrode that covers at least a portion of the common electrode, wherein the pixel electrode receives the pixel data signal, wherein the pixel electrode comprises a plurality of pixel fingers arranged in parallel;
a conductive layer that is covered by the common electrode, wherein the conductive layer, the pixel electrode, and the common electrode form a storage capacitor that stores the pixel data signal during display frames, wherein the conductive layer overlaps at least two of the plurality of pixel fingers;
a gate electrode, wherein the conductive layer is interposed between the gate electrode and the pixel electrode
a first passivation layer that covers the conductive layer, wherein the common electrode is formed on the first passivation layer;
a second passivation layer that covers the common electrode, wherein the pixel electrode is formed on the second passivation layer; and
a via structure that extends through the first and second passivation layers, wherein the via structure electrically couples the pixel electrode to the conductive layer without contacting the common electrode, wherein a portion of the via structure is interposed between the first passivation layer and the second passivation layer and separates the first passivation layer from the second passivation layer, and wherein the portion is in direct contact with the first passivation layer and the second passivation layer.

11. The display pixel defined in claim 10 further comprising:
an organic layer, wherein the conductive layer comprises a transparent conductive layer that is deposited on the organic layer.

12. The display pixel defined in claim 11 further comprising:
a display substrate; and
transistor structures formed on the display substrate, wherein the organic layer covers the transistor structures and wherein the via structure contacts the transistor structures.

13. The display pixel defined in claim 12 wherein the transistor structures include a channel structure formed from a semiconductor material selected from the group consisting of: amorphous silicon, indium gallium zinc oxide, and polysilicon, wherein the gate electrode is interposed between the channel structure and the organic layer, wherein the via structure comprises a portion of the pixel electrode structure that forms an electrical connection between the pixel electrode and the conductive layer.

14. The display defined in claim 1
wherein the via structure electrically couples the source-drain structure, the capacitor electrode structure, and the pixel electrode structure and wherein the via structure comprises first, second, and third overlapping via portions.

15. The display defined in claim 14, wherein the first overlapping via portion is formed from a conductive layer that additionally forms the pixel electrode structure, wherein the second overlapping via portion is formed from the common electrode layer, and wherein the third overlapping via portion is formed from the capacitor electrode structure.

16. The display defined in claim 15 wherein the display further comprises:
a common electrode structure in the common electrode layer, wherein the common electrode structure does not contact the second overlapping via structure.

17. A display, comprising:
a pixel electrode structure;
a capacitor electrode structure that is electrically coupled to the pixel electrode structure;
a common electrode layer that forms a parallel plate capacitance with the capacitor electrode structure, wherein the common electrode layer has a transparent portion and wherein the transparent portion is interposed between the pixel electrode structure and the capacitor electrode structure; and
a source-drain structure that is electrically coupled to the capacitor electrode structure and the pixel electrode structure through a via that overlaps the source-drain structure, wherein a portion of the pixel electrode structure extends through the via to form an electrical connection to the source-drain structure, and wherein the capacitor electrode structure is interposed between the source-drain structure and the pixel electrode structure.

18. The display defined in claim 17 wherein the capacitor electrode structure and the pixel electrode structure form a storage capacitor with the common electrode structure.

19. The display defined in claim 18 wherein the pixel electrode structure comprises first and second pixel fingers.

20. The display defined in claim 19 wherein the capacitor electrode structure and the common electrode layer each overlap the first and second pixel fingers.

* * * * *

UNITED STATES PATENT AND TRADEMARK OFFICE
CERTIFICATE OF CORRECTION

PATENT NO. : 10,642,116 B2
APPLICATION NO. : 14/256852
DATED : May 5, 2020
INVENTOR(S) : Zhibing Ge et al.

Page 1 of 1

It is certified that error appears in the above-identified patent and that said Letters Patent is hereby corrected as shown below:

On the Title Page

Item (57), In the Abstract, Lines 2-3, "storage capacitor chat" should read -- storage capacitor that --

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*